US011012045B2

(12) United States Patent
Woo et al.

(10) Patent No.: US 11,012,045 B2
(45) Date of Patent: May 18, 2021

(54) VARIABLE GAIN AMPLIFIER

(71) Applicant: Apple Inc., Cupertino, CA (US)

(72) Inventors: Sang Hyun Woo, Austin, TX (US);
Paul-Aymeric H. Fontaine, Austin, TX (US)

(73) Assignee: Apple Inc., Cupertino, CA (US)

( * ) Notice: Subject to any disclaimer, the term of this patent is extended or adjusted under 35 U.S.C. 154(b) by 45 days.

(21) Appl. No.: 16/426,947

(22) Filed: May 30, 2019

(65) Prior Publication Data

US 2020/0382087 A1 Dec. 3, 2020

(51) Int. Cl.
*H03F 3/45* (2006.01)
*H03G 1/00* (2006.01)
*H03F 1/08* (2006.01)
*H03F 3/193* (2006.01)

(52) U.S. Cl.
CPC .............. *H03G 1/007* (2013.01); *H03F 1/08* (2013.01); *H03F 3/193* (2013.01); *H03F 3/45475* (2013.01); *H03F 2203/45138* (2013.01)

(58) Field of Classification Search
CPC .................................... H03F 3/45; H03K 5/22
USPC .............................. 330/253, 260; 327/65, 67
See application file for complete search history.

(56) References Cited

U.S. PATENT DOCUMENTS

| 7,391,260 | B2 | 6/2008 | Kim et al. |
| 7,619,473 | B2 | 11/2009 | Tanimoto et al. |
| 8,994,452 | B2* | 3/2015 | Kim .................... H03F 3/45659 330/257 |
| 10,651,979 | B1* | 5/2020 | Katakwar ................ H03K 5/22 |

OTHER PUBLICATIONS

Atsushi Tanaka, et al., "Design of 1 V Operating Fully Differential OTA Using NMOS Inverters in 0.18um CMOS Technology," IEICE Trans. Electron, vol. E92-C, No. 6, Jun. 2009, pp. 822-827.

* cited by examiner

*Primary Examiner* — Steven J Mottola
(74) *Attorney, Agent, or Firm* — Kowert, Hood, Munyon, Rankin & Goetzel, P.C.; Erik A. Heter

(57) ABSTRACT

A variable gain amplifier circuit is disclosed. In one embodiment, an amplifier circuit includes first and second stages. Each stage includes one or more inverter pairs, with one inverter of each pair coupled to receive an inverting component of a differential signal and the other inverter of the pair coupled to receive a non-inverting component. The first stage receives a differential input signal and produces an intermediate differential signal. The second stage receives the intermediate differential signal and produces a differential output signal, the differential output signal being an amplified version of the differential input signal.

20 Claims, 7 Drawing Sheets

VARIABLE GAIN AMPLIFIER

BACKGROUND

Technical Field

This disclosure relates to electronic circuits, and more particularly, to amplifier circuits.

Description of the Related Art

Many modern communications systems can transfer data at very high rates. Some of these communications systems, such as RF (radio frequency) systems, may include one or more variable gain amplifiers. When utilized in an RF system, a variable gain amplifier may be designed to have a wide bandwidth.

A commonly used circuit topology in variable gain amplifiers is the Cherry-Hooper topology. The Cherry-Hooper topology implements a trans-impedance amplifier. This topology may also be implemented for different desired values of gain, bandwidth, or dynamic range, parameters which can be traded off for one another.

SUMMARY

A variable gain amplifier circuit is disclosed. In one embodiment, an amplifier circuit includes first and second stages. Each stage includes one or more inverter pairs, with one inverter of each pair coupled to receive an inverting component of a differential signal and the other inverter of the pair coupled to receive a non-inverting component. The first stage receives a differential input signal and produces an intermediate differential signal. The second stage receives the intermediate differential signal and produces a differential output signal, the differential output signal being an amplified version of the differential input signal.

In one embodiment, the first stage includes a first number of inverters, while the second stage includes a second number of inverters that is greater than the first number. With respect to the second stage, a load resistor is coupled between an inverting output and a non-inverting output. Additionally, first and second feedback resistors are also implemented between inputs and outputs of the second stage. The first feedback resistor is coupled an inverting output and a first input of the second stage, while the second feedback resistor is coupled between the non-inverting output and second input of the second stage. The circuit is designed such that no current flowing through either of the feedback resistors or load resistor is direct current (DC).

BRIEF DESCRIPTION OF THE DRAWINGS

The following detailed description makes reference to the accompanying drawings, which are now briefly described.

Figure 1:
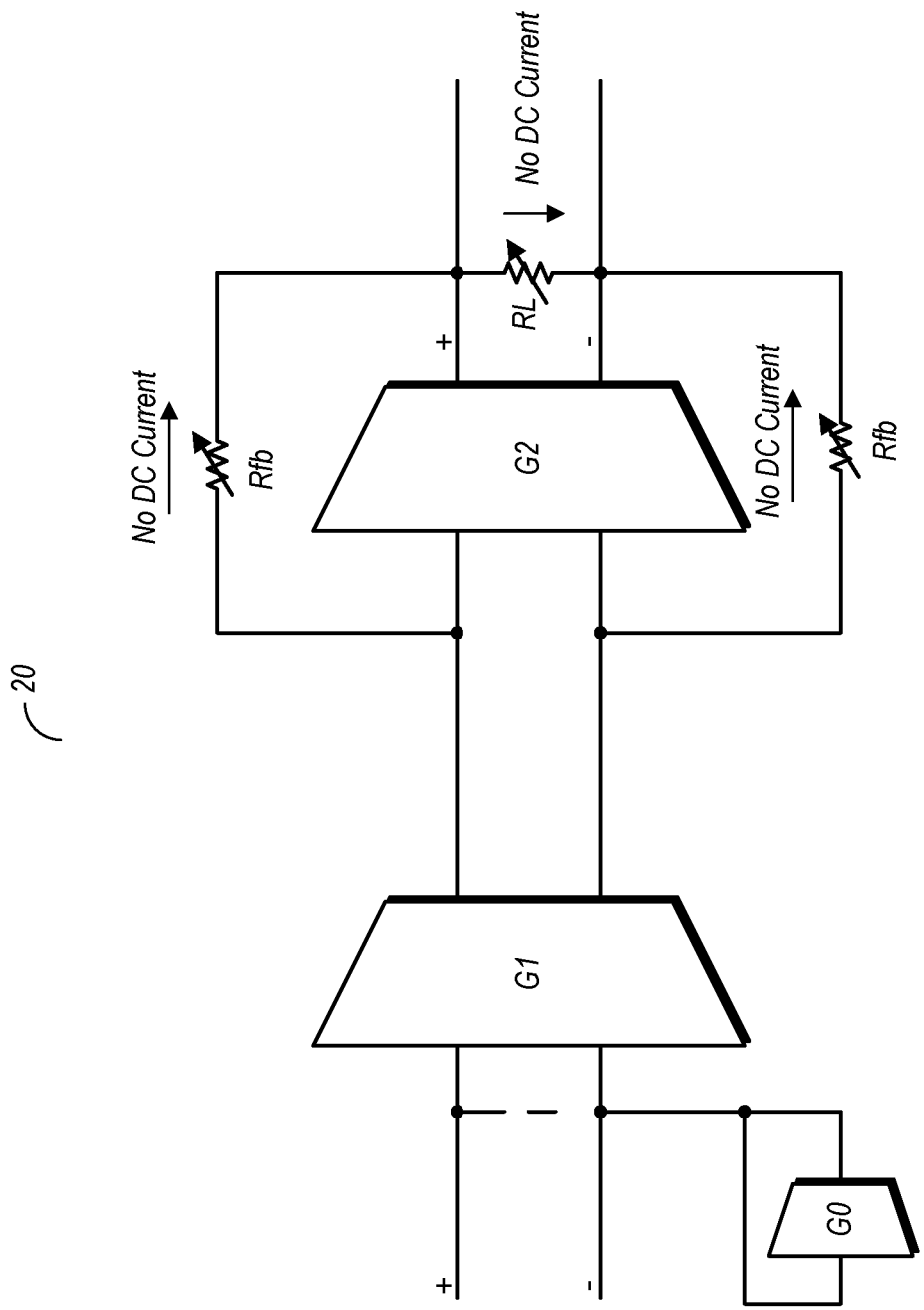
FIG. 1 is a diagram illustrating one embodiment of a variable gain amplifier.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first input" and "second input" can be used to refer to any two of a number of inputs, and not, for example, just two specific inputs.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is generally directed to a variable gain amplifier. In various embodiment, the variable gain amplifier includes first and second stages, each of which is implemented using pairs of inverters. The amplifier signal in one embodiment is a differential signal, with one inverter receiving a first component (e.g., inverting) of the differential signal and the other inverter receiving a second component (e.g., non-inverting) of the differential signal, with each inverter operating on one of the signal components. Although embodiments are possible and contemplated with as few as one inverter pair in each stage, other embodiments include multiple inverter pairs in each stage, with the inverters of a given stage being arranged in parallel. Furthermore, various embodiments may be implemented with a different number of inverter pairs in each stage. For example, one embodiment of an amplifier according to the disclosure may include 10 inverter pairs (10 to receive the inverting component of the signal and 10 to receive the non-inverting component of the signal) in the first stage and 100 inverter pairs in the second stage. However, the number of inverter pairs may vary according to the particular implementation.

With respect to the second stage, a resistor network may also be included. The resistor network may include feedback resistors coupled between input and output nodes for the inverting and non-inverting signal paths. A load resistor may be coupled between the inverting and non-inverting output nodes of the amplifier (which is the second stage output). The amplifier may be designed such that no direct current (DC) flows through these resistors. Due to the absence of DC current through the feedback and load resistors, the gain and bandwidth of the amplifier may be controlled separately and independently from one another. This is in contrast to amplifier circuits in which amplifier gain and bandwidth have a trade-off relationship with one another (e.g., an increase in bandwidth results in a reduction of gain, and vice versa). The absence of DC current through the feedback and load resistors also results in the fact that the common mode voltage for each node (including inputs of G1, the inputs and outputs of G2) does not change for different gain modes. Additionally, the topology of the amplifier circuit disclosed herein may provide high linearity and low power consumption, and easy DC coupling of the input (first) stage. Various embodiments are now discussed in further detail.

As a final preliminary vote before discussing the drawings, it is noted that, as is standard practice in the industry, the differential signal is discussed as having an inverting component (−) and a non-inverting component (+), with corresponding signal nodes being referred to as the inverting and non-inverting signal nodes. This is not to be confused with the use of inverters as the circuit elements in implementation of the amplifier circuit, and these inverters will provide inversion of whatever signal component received, whether that signal component is referred to as inverting or non-inverting. Accordingly, the use of the terms "inverting" and "non-inverting" as referred to the signal components of a differential signal should not be confused with the operation of the inverters in each of the stages of the amplifier circuit.

FIG. 1 is a diagram illustrating one embodiment of a variable gain amplifier. The embodiment shown here is a generalized embodiment. Amplifier 20 as shown here includes a first (input) stage, designated G1, and a second, output stage, designated G2. The amplified signal is a differential signal, conveyed to inverting (−) and non-inverting (+) inputs of G1 on corresponding input nodes. A bias circuit, G0, is also coupled to provide respective bias voltages to each of the inverting and non-inverting input nodes. In one embodiment, G0 may be implemented with as little as a single inverter, with the output thereof being coupled by separate resistive paths to each of the inverting and non-inverting input nodes. During operation, a differential input signal is received by the first stage and output as an intermediate differential signal on first and second intermediate nodes coupled between G1 and G2. The second stage, G2, provides further amplification, providing a differential output signal on inverting and non-inverting output nodes.

As is discussed in further detail below, the first and second stages may be implemented using inverter circuits, in pairs, with each pair including inverters for the inverting signal path and inverters for the non-inverter signal path. While embodiments are possible and contemplated with as few as one inverter pair in each of the stages, many embodiments include a number of inverter pairs in each of the stages. Furthermore, the number of inverter pairs in each of the stages may be different from one another, such as in the example discussed above. The inverters in a given signal path may be arranged in parallel, with their respective outputs being additive on a single signal node.

A resistor network is implemented around the second stage, G2. This resistor network includes two feedback resistors, Rfb, and a load resistor, RL. A first one of the feedback resistors is coupled between the inverting output node and the first intermediate node, while a second one of the feedback resistors is coupled between the non-inverting output node and the second intermediate node. The load resistor RL is coupled between the inverting and non-inverting output nodes. In this particular example, the resistors are shown as variable resistors, although embodiments are possible and contemplated in which these resistors have fixed values. The feedback resistors Rfb in the embodiment shown are implemented for the purposes of gain control. Meanwhile, the load resistor RL is implemented for both gain and bandwidth control. With the gain being controlled by feedback resistors Rfb and load resistor RL, gain transition time of the illustrated embodiment may be relatively fast.

As noted above there is no direct current through the feedback and load resistors. This has a number of different implications for the operation of amplifier circuit 20. Since there is no direct current through these resistors, their respective values may be chosen without consideration of DC biasing. This further allows the bandwidth and gain of the amplifier to be controlled separately and independently from one another, which may be done through the selection of the values of the various resistors of the resistor network. Furthermore, since there is no direct current through these resistors, the common mode voltage may be maintained for different gain modes. When used with the inverter type feedback structure, certain components (e.g., gm2 components, which are the derivative of transconductance gm) may be canceled and enable this amplifier topology to maintain high linearity. Utilizing the second stage with the feedback resistors may provide self-biasing, thereby maximizing the transconductance, gm, of the PMOS and NMOS devices that implement the inverters in each stage. Furthermore, the amplifier may be DC coupled, and may provide fast automatic gain control (AGC) response time. As will be discussed below, the inverter cell structures themselves include no resistors, which may allow for higher voltage headroom, and may also enable current re-use in these cells, resulting in lower power consumption.

Figure 2:
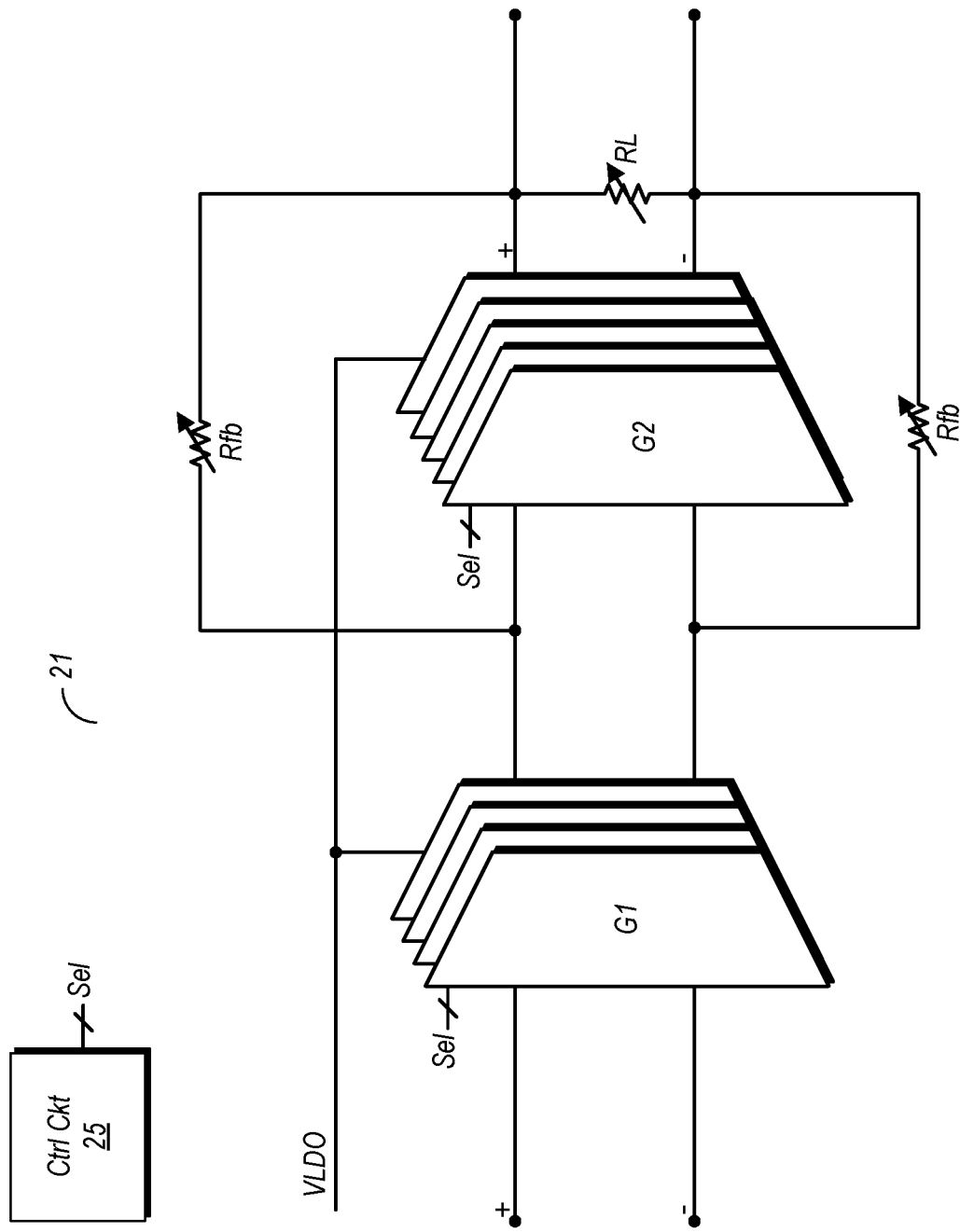
FIG. 2 is a diagram illustrating another embodiment of a variable gain amplifier.

FIG. 2 is a diagram illustrating another embodiment of a variable gain amplifier. In this embodiment, amplifier 21 shows the first and second stages, G1 and G2 respectively, as having multiple cells. Each of the cells may represent one inverter pair. The exact number of cells in each stage may vary from one embodiment to the next, and the number of cells in each of the first and second stages may be different from one another.

As shown here, the cells of G1 and G2 are coupled to receive a supply voltage, VLDO. This supply voltage may be compensated for process and temperature variations by a tracking circuit. This is discussed further below in reference to FIG. 4.

FIG. 2 also shows a control circuit 25, which is configured to output a number of selection signals (Sel) that can be used to enable the cells of each of the first and second stages. In this embodiment, the use of the selection signals to enable particular cells can be used for providing less variation in the voltage VLDO over process and temperature variations. Accordingly, control circuit 25 may be used to vary the number of cells (and thus the number of inverter pairs) selected in each stage to at least partly control the variation of VLDO to a desired value at a given time.

Figure 3:
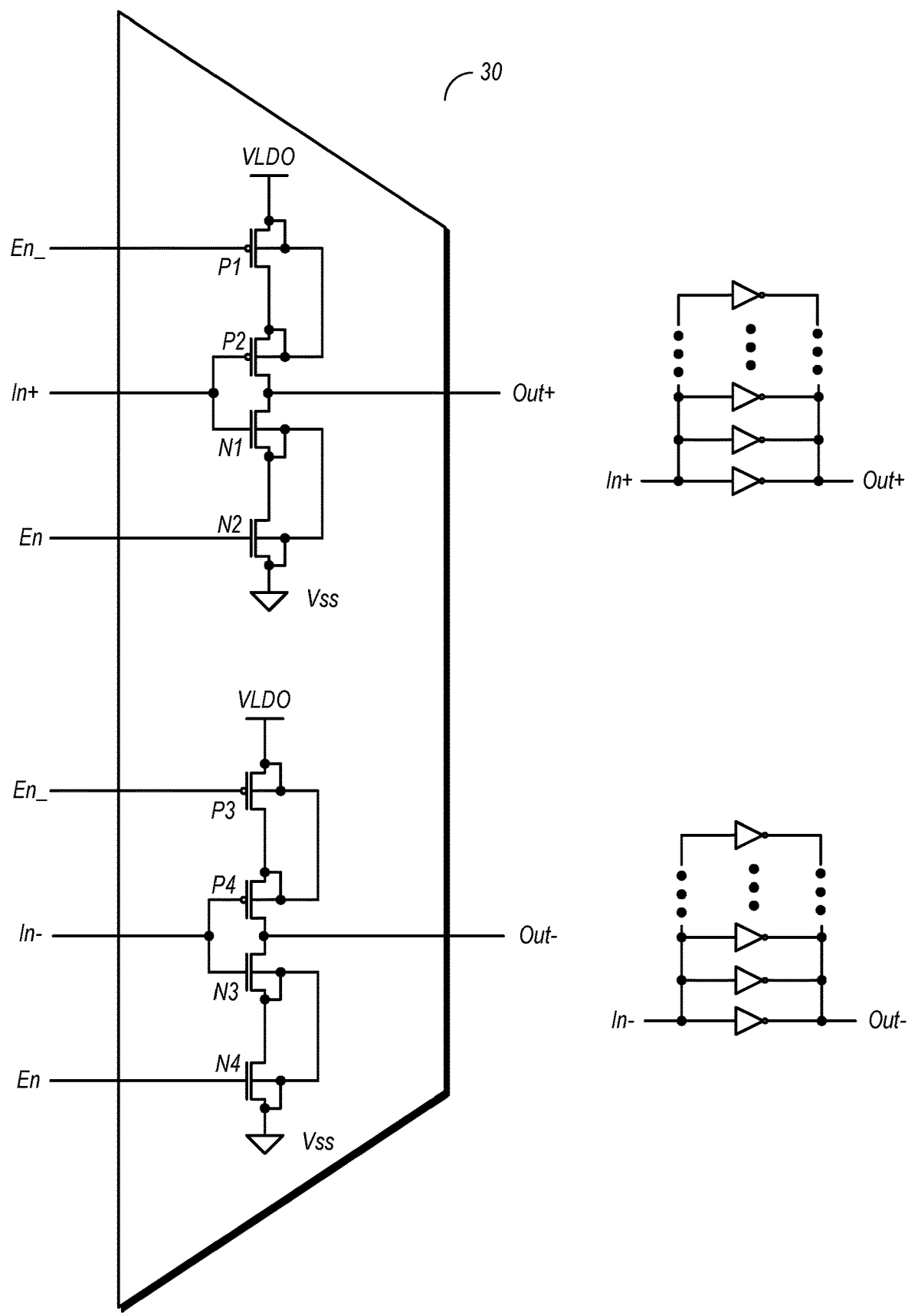
FIG. 3 is a diagram illustrating one embodiment of inverter circuitry used in an embodiment of the variable gain amplifier of FIG. 1.

FIG. 3 is a diagram illustrating one embodiment of inverter circuitry used in an embodiment of the variable gain amplifier of FIG. 1. In particular, FIG. 3 schematically illustrates the arrangement of inverters in a single cell, as well as the parallel arrangement of inverters across a number of cells in a given stage.

Cell 30 in the embodiment shown can be used to implement either of the stages G1 and G2 as discussed above. The example cell 30 includes two inverters, each of which is coupled to receive VLDO as its supply voltage. A first inverter, in the non-inverting signal path, is implemented with PMOS transistor P1 and P2 along with NMOS transistor N1 and N2. The first inverter as shown here receives a non-inverting component, In+, of a differential input signal, and provides a non-inverting component, Out+, of a differential output signal. A second inverter is implemented using PMOS transistors P3 and P4, and NMOS transistor N3 and N4. The second inverter is coupled to receive an inverting component, In−, of the differential input signal, and provide an inverting component, Out-of the differential output signal. Each of the transistors shown in this embodiment are body-connected devices, although this may not be the case for all embodiments falling within the scope of this disclosure.

As discussed above in reference to FIG. 2, the number of inverter cells active at a given time may be selected according to selection signals. Accordingly, both of the inverters here receive enable signals, En and En_, which may be derived from the select signals provided by control circuit 25 in any suitable manner that will be apparent to those skilled in the art. When the example cells shown here is selected, the En_ signal is asserted low to respective gate terminals of transistors P1 and P3, while the En signal is provided high to respective gate terminals of transistors N2 and N4. Thus, the inverters here are tri-stateable and may thus be activated or de-activated as desired.

As mentioned above, each stage may include a number of cells, with their respective inverter pairs arranged in parallel. The right hand portion of FIG. 3 shows a symbolic arrangement of inverters in parallel, as they would be connected in embodiments wherein each stage includes a number of cells, and thus a number of inverter pairs. As shown here, inverters in the non-inverting signal path are connected in parallel, as are inverters in the inverting signal path. For the sake of illustration, the enable signal connections are not shown in this portion of the drawing, although it is to be understood that they are present as shown in the left-hand portion drawing of cell 30.

Figure 4:
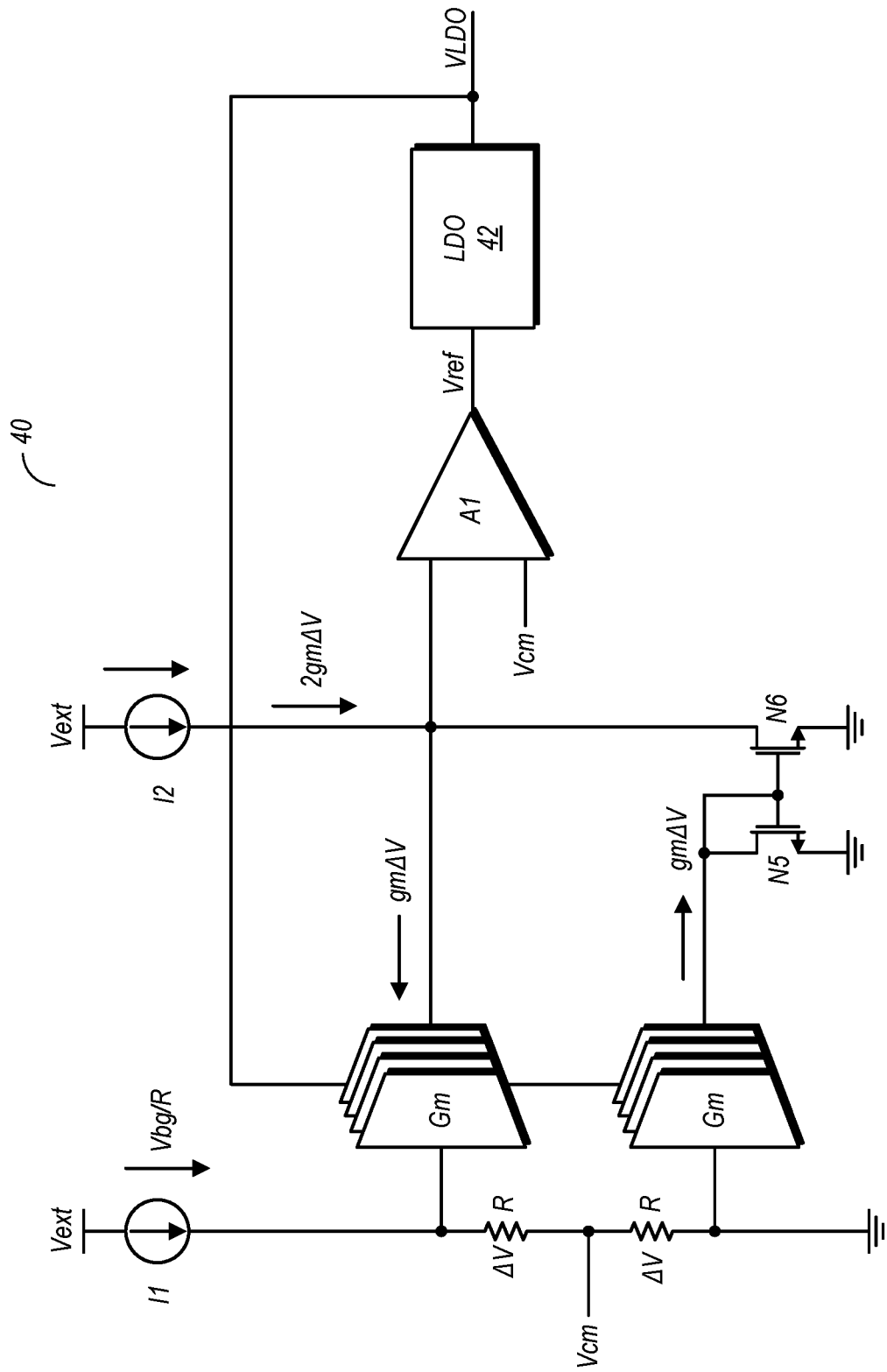
FIG. 4 is a diagram illustrating one embodiment of a tracking circuit used with a low dropout (LDO) voltage regulator used to provide a supply voltage to a variable gain amplifier.

FIG. 4 is a diagram illustrating one embodiment of a tracking circuit used with a low dropout (LDO) voltage regulator used to provide a supply voltage to a variable gain amplifier. In the embodiment shown, tracking circuit 40 is coupled to provide a reference voltage, Vref, to LDO 42. Tracking circuit 40 may compensate for process and temperature variations, and may adjust the LDO output voltage, VLDO, to that various embodiments of the amplifier circuit disclosed herein operate as desired.

Tracking circuit 40 in the embodiment shown includes a plurality of transconductance circuits, or cells, Gm, in two separate branches, with each of the cells being coupled to receive the LDO output voltage, VLDO. These cells may be implemented in various ways, with the simplest implementation being a single transistor for each cell (e.g., an NMOS transistor). The inputs to these devices are received from the circuit path extending between the external voltage supply node, Vext (from which an external power supply voltage is provided), and ground. This circuit path includes current source I1 (which provides a current equal to a bandgap voltage, Vbg, divided by the resistance R of the resistors). The source of the bandgap voltage is not shown in this drawing, but may be any suitable circuit for generating a bandgap voltage. The two resistors R in the path each provide a voltage drop of ΔV. A common mode voltage, Vcm, is provided to the junction of the two resistors, and may be generated by a circuit capable of generating such a voltage. It is noted that Vcm may be the common mode voltage of the differential signal amplified by the amplifier circuit discussed above.

A second circuit path includes current source 12, and transistor N6, which is part of a current mirror that also includes the diode-coupled device N5. A current of gmΔV may be conveyed to the current mirror. The current through the second current leg is 2gmΔV, half of which (gmΔV) is conveyed to the upper group of cells, with the lower group outputting an equal amount to the current mirror. The second circuit leg also includes a junction coupled to an input of amplifier A1. The voltage on this junction may be referred to as a tracking voltage, and can vary with process and temperature. The other input to amplifier A1 is the common mode voltage, Vcm. Using this circuit, the reference voltage is generated and provided to LDO 42, and thus forms a basis for generating its output voltage, VLDO. Accordingly, changes to VLDO may be based on changes to the tracking voltage input into amplifier A1, as Vcm may remain relatively constant.

Other embodiments of a tracking circuit are possible and contemplated. For example, an embodiment which includes only the upper group of transconductance circuits/cells, Gm, but not the lower group, or the current mirror, may also be implemented in embodiments in which it can provide tracking ability to meet the specified design goals. Generally speaking, a tracking circuit in various embodiments may be implemented to keep two parameters, transconductance and common mode voltage, to values that are substantially fixed and stable. Through achieving relatively steady values of these parameters, the reference voltage Vref, and thus the LDO output voltage, VLDO, may be adjusted in an adaptive manner such that the amplifier circuit may meets its specified design criteria.

Figure 5:
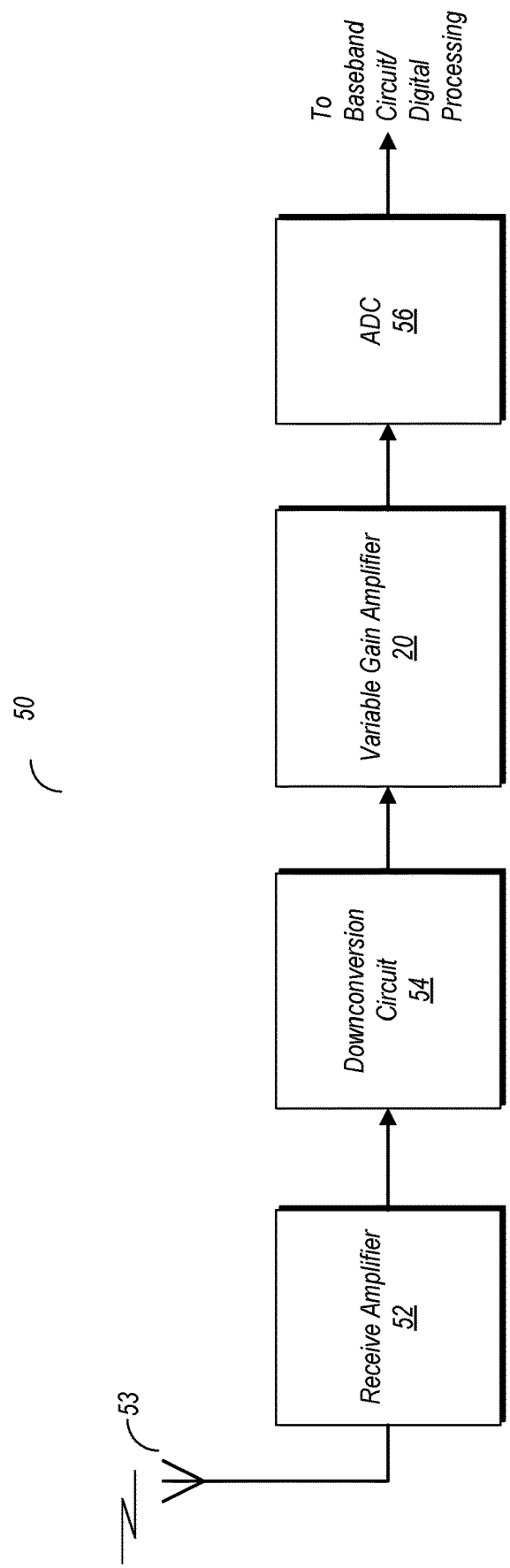
FIG. 5 is a block diagram of one embodiment of a receiver including an embodiment of a variable gain amplifier according to the disclosure.

FIG. 5 is a block diagram of one embodiment of a receiver including an embodiment of a variable gain amplifier according to the disclosure. Receiver system 50 in the embodiment shown is provided here as a simplified example application of the variable gain amplifier of this disclosure, although it is not intended to be limiting.

Receiver 50 in the embodiment shown includes a receiver amplifier 52 coupled to receiver a radio frequency (RF) carrier signal via antenna 53. The RF signal may be modulated with information to be conveyed. The receiver amplifier is a high frequency amplifier, and provides an amplified version of the received RF signal to downconversion circuit 54. Downconversion circuit 54 in the embodiment shown downconverts the received signal (and more particularly, the carrier) from the RF to a baseband frequency. This may occur in a single stage in a direct conversion architecture (having a single mixer), or in multiple stages in a heterodyne architecture (e.g., two mixers). The output of downconversion circuit 54 is provided to variable gain amplifier 20, which may be any embodiment in accordance with those discussed above. Variable gain amplifier 20 may amplify the received signal at the baseband frequency, and output it to analog-to-digital converter (ADC) 56. Thereafter, ADC 56 may convert the received baseband signal into the digital domain, where it can be forwarded to a baseband circuit for digital processing, including extraction of the information carried thereon.

Figure 6:
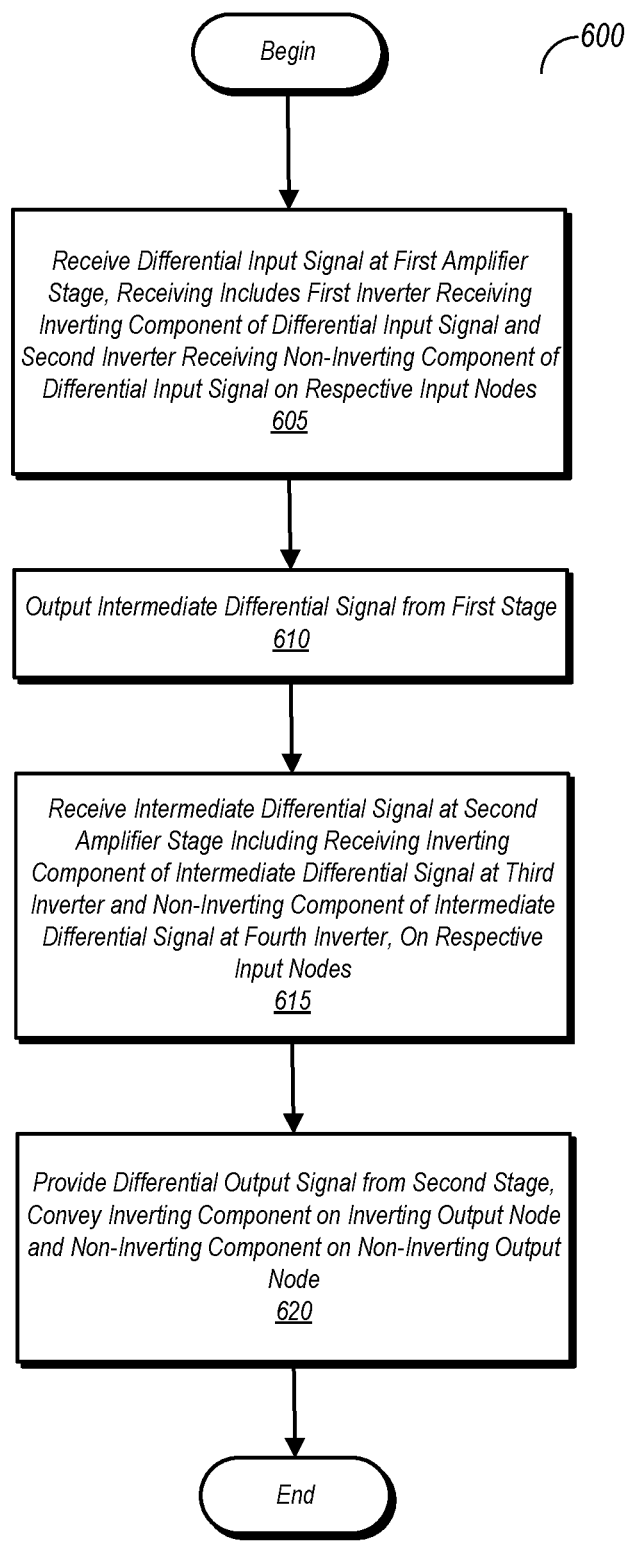
FIG. 6 is a flow diagram illustrating one embodiment of a method for operating a variable gain amplifier.

FIG. 6 is a flow diagram illustrating one embodiment of a method for operating a variable gain amplifier. Method 600 may be performed by any of the various embodiments of the variable gain amplifier discussed above. Embodiments of a variable gain amplifier capable of carrying out method 600 but otherwise not discussed herein are also contemplated, and may fall within the scope of this disclosure.

Method 600 includes receiving a differential input signal at a first stage of an amplifier circuit, wherein receiving the differential input signal includes a first inverter receiving an inverting component of the differential input signal on an inverting input node and a second inverter receiving a non-inverting component of the differential input signal on a non-inverting input node (block 605), and outputting, from the first stage of the amplifier circuit, an intermediate differential signal (block 610). Following the first stage amplification, the method further includes receiving the intermediate differential signal at a second amplifier stage, wherein receiving the intermediate differential signal includes a third inverter receiving a first component of the intermediate differential signal on an first intermediate node and a fourth inverter receiving a second component of the intermediate differential signal on a second intermediate node (block 615). Method 600 concludes with outputting, from the second stage, a differential output signal, wherein outputting the differential output signal includes conveying an inverting component of the differential output signal on an inverting output node conveying a non-inverting component of the output signal on a non-inverting output node (block 620).

In various embodiments, method 600 further includes providing a first feedback signal through a first feedback resistor coupled between the inverting output node and the first intermediate node and providing a second feedback signal through a second feedback resistor coupled between the non-inverting output node and the second intermediate node. The first and second feedback signals include no DC current.

In some embodiments of variable gain amplifier, the first stage includes a first plurality of inverter pairs including the first and second inverters and the second stage includes a second plurality of inverter pairs including the third and fourth inverters. Method 600, when carried about by such an embodiment of a variable gain amplifier, may include a low-dropout (LDO) voltage regulator providing a supply voltage to each of the first and second pluralities of inverter pairs. The method may further include providing a reference voltage to the LDO voltage regulator from a tracking circuit. The tracking circuit may receive the supply voltage from the LDO voltage regulator and further receive an external voltage. The tracking circuit may adjust the reference voltage for process and temperature variations. The method may further includes generating a tracking voltage using the tracking circuit, providing the tracking voltage to a first input of an amplifier in the tracking circuit, providing a common mode voltage to a second input of the amplifier, and generating the reference voltage based on the tracking voltage and the common mode voltage.

Figure 7:
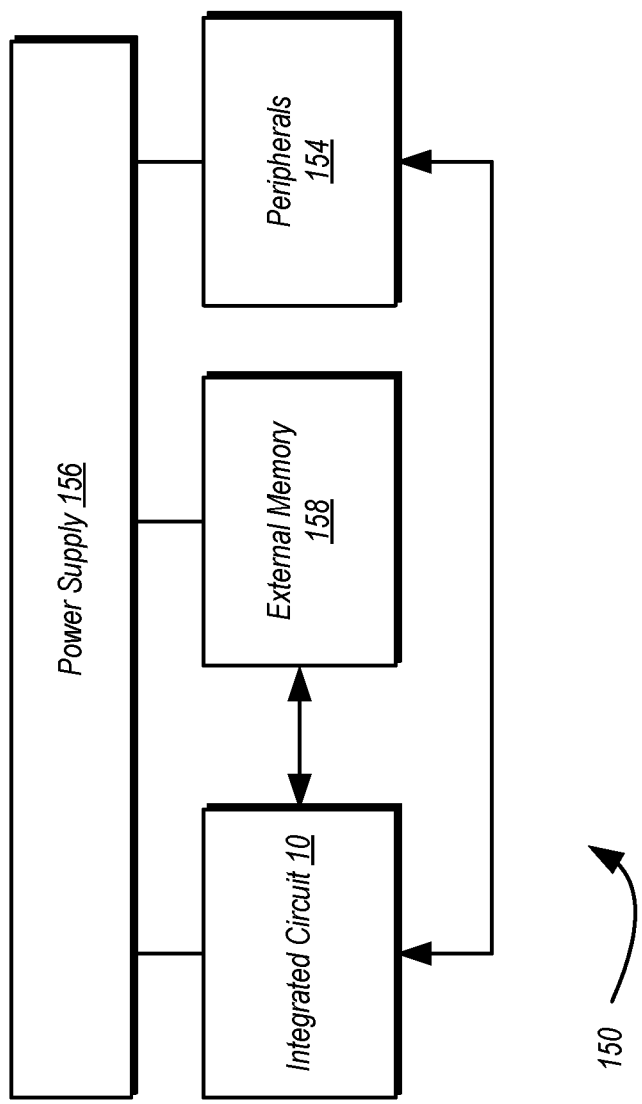
FIG. 7 is a block diagram of one embodiment of an example system.

Turning next to FIG. 7, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

System 150 in the embodiment shown may include one or more instances of a variable gain amplifier, along with the tracking circuit, as disclosed herein. These circuits may be implemented on IC 10, or on an IC associated with one of peripherals 154. The variable gain amplifier and tracking circuit may be associated with circuitry such as a wireless transmitter or other system.

Numerous variations and modifications will become apparent to those skilled in the art once the above disclosure is fully appreciated. It is intended that the following claims be interpreted to embrace all such variations and modifications.

What is claimed is:

1. A circuit comprising:
   a first stage configured to receive a differential input signal, the first stage having one or more inverter pairs including a first inverter configured to receive an inverting component of the differential input signal on an inverting input node and a second inverter configured to receive a non-inverting component of the differential input signal on a non-inverting input node, wherein the first stage is configured to output an intermediate differential signal;
   a second stage coupled to receive the intermediate differential signal, where second stage having one or more inverter pairs including a third inverter coupled to receive a first component of the intermediate differential signal on a first intermediate node and a fourth inverter coupled to receive a second component of the intermediate differential signal on a second intermediate node, wherein the second stage is configured to provide a differential output signal, wherein an inverting component of the differential output signal is conveyed on an inverting output node and wherein a non-inverting component of the output signal is conveyed on a non-inverting output node;
   a low dropout (LDO) voltage regulator coupled to provide a supply voltage to each of the one or more inverter pairs of the first stage and each of the one or more inverter pairs of the second stage.

2. The circuit as recited in claim 1, further comprising:
   a first feedback resistor coupled between the inverting output node and the first intermediate node;
   a second feedback resistor coupled between the non-inverting output node and the second intermediate node; and
   a load resistor coupled between the inverting output node and the non-inverting output node.

3. The circuit as recited in claim 2, wherein the circuit is configured such that, during operation, no DC current flows through the first feedback resistor, the second feedback resistor, and the load resistor.

4. The circuit as recited in claim 1, wherein the first stage includes a first plurality of inverters, and wherein the second stage includes a second plurality of inverters.

5. The circuit as recited in claim 4, wherein the second plurality of inverters includes a greater number of inverters than the first plurality of inverters.

6. The circuit as recited in claim 4, wherein each of the first plurality of inverters and each of the second plurality of inverters is tri-stateable.

7. The circuit as recited in claim 1, further comprising a tracking circuit coupled to provide a reference voltage to the LDO voltage regulator, wherein the tracking circuit is configured to adjust the reference voltage for process and temperature variations.

8. The circuit as recited in claim 7, wherein the tracking circuit is coupled to receive the supply voltage from an output of the LDO voltage regulator and further coupled to receive an external voltage.

9. The circuit as recited in claim 7, wherein the tracking circuit includes:
   an amplifier circuit coupled to provide the reference voltage to the LDO voltage regulator, the amplifier circuit having a first input coupled to receive a common mode voltage and a second input coupled to receive a tracking voltage;
   one or more transconductance devices coupled to receive the supply voltage output from the LDO voltage regulator, and configured to generate the tracking voltage.

10. A method comprising:
    receiving a differential input signal at a first stage of an amplifier circuit, wherein receiving the differential input signal includes a first inverter receiving an inverting component of the differential input signal on an inverting input node and a second inverter receiving a non-inverting component of the differential input signal on a non-inverting input node;
    outputting, from the first stage of the amplifier circuit, an intermediate differential signal;
    receiving the intermediate differential signal at a second amplifier stage, wherein receiving the intermediate differential signal includes a third inverter receiving a first component of the intermediate differential signal on a first intermediate node and a fourth inverter receiving a second component of the intermediate differential signal on a second intermediate node; and
    outputting, from the second stage, a differential output signal, wherein outputting the differential output signal includes conveying an inverting component of the differential output signal on an inverting output node conveying a non-inverting component of the output signal on a non-inverting output node;
    wherein the first stage includes a first plurality of inverter pairs including the first and second inverters and the second stage includes a second plurality of inverter pairs including the third and fourth inverters, and wherein the method further comprises a low-dropout (LDO) voltage regulator providing a supply voltage to each of the first and second pluralities of inverter pairs.

11. The method as recited in claim 10, further comprising:
providing a first feedback signal through a first feedback resistor coupled between the inverting output node and the first intermediate node; and
providing a second feedback signal through a second feedback resistor coupled between the non-inverting output node and the second intermediate node;
wherein the first and second feedback signals include no DC current.

12. The method as recited in claim 10, further comprising:
providing a reference voltage to the LDO voltage regulator;
a tracking circuit receiving the supply voltage from the LDO voltage regulator and further receiving an external voltage; and
adjusting the reference voltage for process and temperature variations using the tracking circuit.

13. The method as recited in claim 12, further comprising:
generating a tracking voltage using the tracking circuit;
providing the tracking voltage to a first input of an amplifier in the tracking circuit;
providing a common mode voltage to a second input of the amplifier;
generating the reference voltage based on the tracking voltage and the common mode voltage.

14. A system comprising:
a receive amplifier configured to amplifier a radio frequency signal received, at a first frequency, via an antenna;
a downconversion circuit coupled to receive the radio frequency signal and generate a first differential signal at a second frequency less than the first frequency; and
a variable gain amplifier (VGA) coupled to the downconversion circuit, the VGA including:
  a first stage coupled to receive the first differential signal, the first stage including a first inverter pair having a first inverter coupled to receive an inverting component of the first differential signal and a second inverter coupled to receive a non-inverting component of the first differential signal, wherein the first stage is configured output a second differential signal;
  a second stage coupled to receive the second differential signal, the second stage having a second inverter pair including a third inverter coupled to receive an first component of the second differential signal and a fourth inverter coupled to receive a second component of the second differential signal, wherein the second stage is configured to output a non-inverting component of a third differential signal on a non-inverting output node and an inverting component of the third differential signal on an inverting output node.

15. The system as recited in claim 14, wherein the VGA further includes:
a first feedback resistor coupled between the inverting output node and a first intermediate node coupled to convey the first component of the second differential signal;
a second feedback resistor coupled between the non-inverting output node and a second intermediate node coupled to convey the second component of the second differential signal; and
a load resistor coupled between the inverting output node and the non-inverting output node;
wherein the VGA is configured such that, during operation, no DC current flows through the first feedback resistor, the second feedback resistor, and the load resistor.

16. The system as recited in claim 14, wherein the first stage of the VGA includes a first plurality of inverters including the first and second inverters, wherein the second stage of the VGA includes a second plurality of inverters including the third and fourth inverters, wherein a number of inverters of the second plurality of inverters is greater than a number of inverters of the first plurality of inverters.

17. The system as recited in claim 14, further comprising:
a low dropout (LDO) voltage regulator coupled to provide a supply voltage to the first and second stages of the VGA;
a tracking circuit configured to generate a reference voltage provided to the LDO voltage regulator, wherein the tracking circuit is configured to adjust the reference voltage responsive to process and temperature variations;
wherein the tracking circuit is coupled to receive the supply voltage from the LDO and further coupled to receive a voltage provided from an external source.

18. The system as recited in claim 17, wherein the tracking circuit includes:
an amplifier circuit coupled to provide the reference voltage to the LDO voltage regulator, the amplifier circuit having a first input coupled to receive a common mode voltage and a second input coupled to receive a tracking voltage; and
one or more transconductance devices coupled to receive the supply voltage output from the LDO voltage regulator, and configured to generate the tracking voltage.

19. The circuit as recited in claim 1, further comprising a radio receiving including a variable gain amplifier having the first and second stages, and further comprises a downconversion circuit coupled to receive a radio frequency signal at a first frequency and generate the differential signal at a second frequency that is less than the first frequency, wherein the variable gain amplifier is coupled to receive the differential signal from the downconversion circuit.

20. The method of claim 10, further comprising:
receiving a radio signal at a first frequency; and
generating, using a downconversion circuit, the differential signal at a second frequency that is less than the first frequency.

* * * * *